US006661706B2

(12) United States Patent
Kawai et al.

(10) Patent No.: US 6,661,706 B2
(45) Date of Patent: Dec. 9, 2003

(54) SEMICONDUCTOR STORAGE DEVICE HAVING PAGE COPYING

(75) Inventors: Koichi Kawai, Yokohama (JP); Kenichi Imamiya, Tokyo (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/194,337

(22) Filed: Jul. 12, 2002

(65) Prior Publication Data

US 2003/0016559 A1 Jan. 23, 2003

(30) Foreign Application Priority Data

Jul. 17, 2001 (JP) ........................................ 2001-216980

(51) Int. Cl.[7] .............................................. G11C 16/04
(52) U.S. Cl. ........................... 365/185.12; 365/185.17; 365/185.33
(58) Field of Search ..................... 365/185.12, 185.17, 365/185.33, 185.11, 189.05

(56) References Cited

U.S. PATENT DOCUMENTS 5,822,245 A  * 10/1998  Gupta et al. ........... 365/185.12
6,023,423 A     2/2000  Aritome ................ 365/185.11

FOREIGN PATENT DOCUMENTS

JP         9-180477         7/1997

OTHER PUBLICATIONS

Nakamura et al., *A Novel Sense Amplifier for Flexible Voltage Operation NAND Flash Memories, 1995 Symposium on VLSI Circuits Digest of Technical Papers*, 1995, pp. 71–72.

* cited by examiner

*Primary Examiner*—David Lam
(74) *Attorney, Agent, or Firm*—Frommer Lawrence & Haug LLP

(57) ABSTRACT

Data read from memory cells of one page in a memory cell array that corresponds to a page address of a copy source is sensed and latched by a sense/latch circuit. The sense/latch circuit has a plurality of latch circuits, and the plurality of latch circuits is specified according to the column address. The latch circuit specified in accordance with the column address is supplied with the data to be rewritten. The latch circuit specified in accordance with its address latches the data to be rewritten, whereby rewriting of the data is performed. The data of one page after rewritten is written into the page in the memory cell array that corresponds to the page address of a copy destination.

17 Claims, 10 Drawing Sheets

SEMICONDUCTOR STORAGE DEVICE HAVING PAGE COPYING

CROSS-REFERENCE TO RELATED APPLICATIONS

This application is based upon and claims the benefit of priority from the prior Japanese Patent Application No. 2001-216980, filed Jul. 17, 2001, the entire contents of which are incorporated herein by reference.

BACKGROUND OF THE INVENTION

1. Field of the Invention

The present invention relates to a semiconductor storage device having a data copying function that writes data stored in an area of a memory cell array into another area, and more particularly to a flash memory to which a large batch of data is written.

2. Description of the Related Art

A NAND flash memory is known as a kind of a non-volatile memory. In the NAND flash memory, a plurality of memory cells constituting non-volatile transistors are connected in series to form a NAND cell. Data writing is applied to a plurality of memory cells in parallel, and data erasure is performed electrically by batching data on the basis of a block unit that is constituted of a plurality of NAND cells. The data writing in the NAND flash memory comprises sequentially supplying a sense/latch circuit that includes a plurality of latch circuits with data to be written, and supplying a memory cell array with the data latched by the sense/latch circuit via a bit line.

The reason why the data to be written is latched by the sense/latch circuit is that a data writing method of the NAND flash memory is one in which writing is performed by batching a large quantity of data in order to accelerate the effective speed. A writing unit in the NAND flash memory is called one page. Normally, one page is constituted of a plurality of memory cells having a common word line.

When data writing is performed with a NAND flash memory, normally, one batch of data is written in one block because of the simplicity in data management. This makes a free area in one block fairly large, resulting in ineffective use of a data area.

In FIG. 1, a plurality of blocks 52 are provided in a memory cell array 51. In each of the blocks 52, areas that are shaded indicate where data is written, and other areas indicate where data is not written.

Therefore, when a NAND flash memory is used, data of one page in a certain block is read out from the data that has once been written, and the read data is temporarily latched by the sense/latch circuit. The data latched by the sense/latch circuit is then written into a page of the free area in a block that is different from the block where the data was read out. This enables effective use of memory space. Such an operation is called page copying. Page copying enables effective use of memory space.

As shown in FIG. 2, the NAND flash memory has a data area 53 for storing usual data, and in addition to this, the memory space called a redundant area 54. The redundant area 54 is the shaded area in FIG. 2. This redundant area 54 is provided in every page, and is usually used for storing data concerned with the data storage state of each page. For example, state of a page can be written in the redundant area 54; an error check code (ECC) used for error correction of data, data indicating that data of the corresponding page is erasable, and data indicating that the data of the corresponding page is copied data.

If page copying is performed, the data read from the page of a copy source is written into the page of a copy destination as it is, including the data in the redundant area 54. As a result, in the destination where the page is copied, the data in the redundant area 54 does not reflect the state of the page correctly. When performing page copying, it is necessary to be able to rewrite the data with regard to the redundant area 54 while keeping the data in the data area 53 as it is.

However, it has been impossible to rewrite part of the data in conventional page copying without reading data out of the memory. This has led to a desire for the NAND flash memory capable of rewriting part of the data during the page copying.

BRIEF SUMMARY OF THE INVENTION

According to a first aspect of the present invention, there is provided a semiconductor storage device comprises: a memory cell array which data is written into and read from every page; and control circuits, connected to the memory cell array, for rewriting at least part of the data in the data of one page read from an arbitrary page in the memory cell array, and writing the rewritten data into another page in the memory cell array.

According to a second aspect of the present invention, there is provided a semiconductor storage device comprises: a memory cell array constituted of a plurality of word lines, a plurality of bit lines, and a plurality of memory cells which are connected to the plurality of word lines and the plurality of bit lines, data writing and data reading are performed for every page that is constituted of the plurality of memory cells commonly connected to one word line; a row decoder connected to the plurality of word lines for selecting an arbitrary word line from the plurality of word lines and selecting an arbitrary page in the memory cell array; and a sense/latch circuit connected to the plurality of word lines for sensing data of one page read from the memory cell array and latching the sensed data when reading data from the memory cell array, and for supplying the memory cell array with the latched data of one page and rewriting arbitrary data from the latched data of one page when writing data in the memory cell array.

According to a third aspect of the present invention, there is provided an operation method of a semiconductor storage device comprises: reading data in parallel from a plurality of memory cells in a certain memory area of a non-volatile semiconductor storage device that has a plurality of memory areas each including a plurality of memory cells; latching the read data by a plurality of latch circuits, and rewriting at least part of the data latched by the plurality of latch circuits; and writing the data at least part of which is rewritten into the plurality of memory cells of the memory area that is different from the memory area from which the data is read.

DETAILED DESCRIPTION OF THE INVENTION

One embodiment of the present invention will be described in detail with reference to the drawings.

Figure 1:
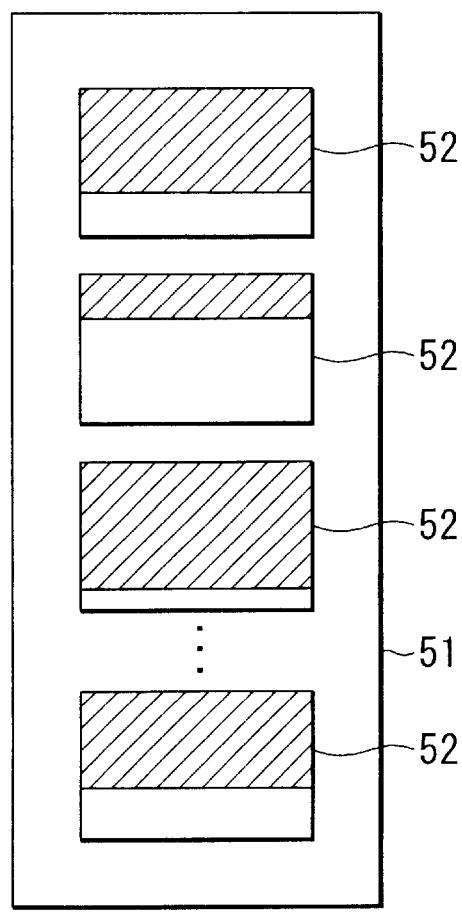
FIG. 1 is a block diagram of a memory cell array of a conventional NAND flash memory.
Figure 2:
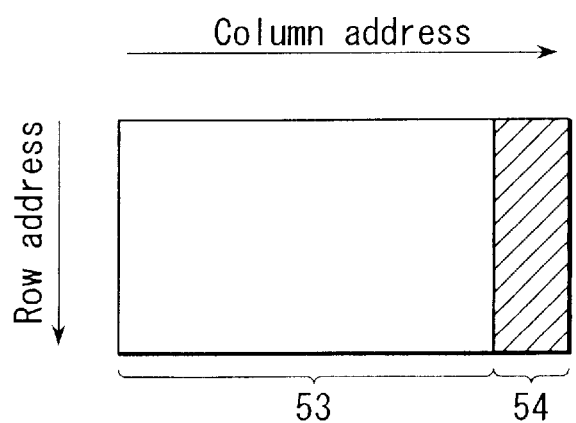
FIG. 2 is a view showing memory space of the NAND flash memory of FIG. 1.
Figure 3:
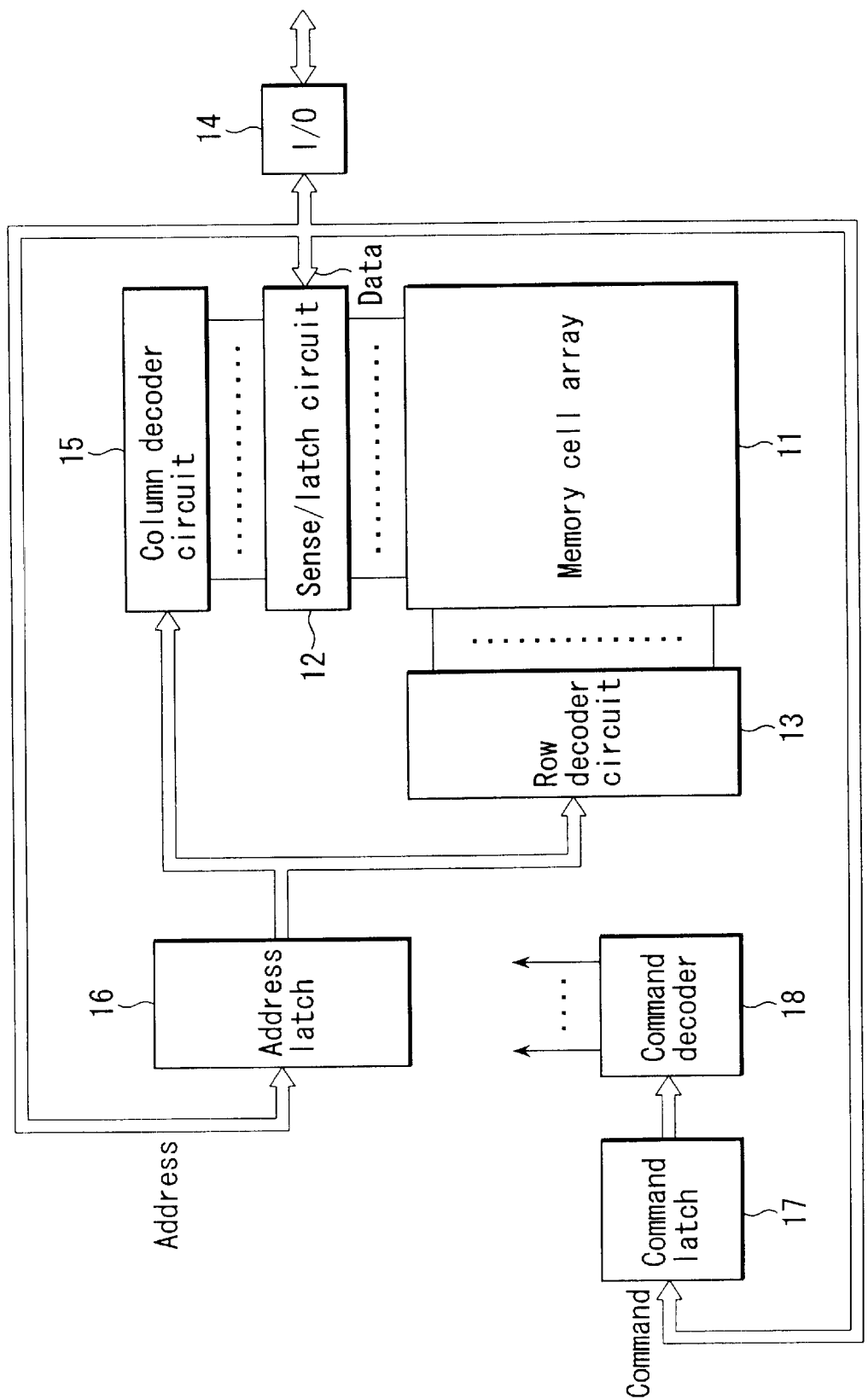
FIG. 3 is a block diagram of the NAND flash memory in one embodiment of the present invention.

FIG. 3 is a block diagram showing an entire constitution of an NAND flash memory according to one embodiment of the present invention.

In a memory cell array 11, a plurality of word lines, a select gate line, and a bit line are provided. A plurality of memory cells are connected to the plurality of word lines and the bit line. As described later, the plurality of memory cells is divided into a plurality of blocks.

The memory cell array 11 is connected to a sense/latch circuit 12 and a row decoder circuit 13 that selectively drives the plurality of word lines and the select gate line.

The sense/latch circuit 12 has a plurality of latch circuits. When reading data from the memory cell array 11, the sense/latch circuit 12 senses data to be read via the bit line and temporarily latches the sensed data. When writing data into the memory cell array 11, the sense/latch circuit 12 temporarily latches data to be written and supplies the memory cell array 11 with the data via the bit line. An input-output buffer (I/O buffer) 14 and a column decoder circuit 15 are connected to the sense/latch circuit 12. In data reading, among data to be read that is latched by the sense/latch circuit 12, data selected depending on the decoding output of the column decoder circuit 15 is read to the outside of a memory via the I/O buffer 14. In data writing, data to be written supplied from the outside of the memory via the I/O buffer 14 is sent to and latched by the latch circuit in the sense/latch circuit 12 selected depending on the decoding output of the column decoder circuit 15.

When reading and writing data, the row decoder circuit 13 selectively drives the word lines and select gate line in the memory cell array 11, and selects the memory cells of one page in the memory cell array 11 in parallel.

An address latch 16 is connected to the I/O buffer 14, and latches row addresses and column addresses input via the I/O buffer 14. The latched row addresses are supplied to the row decoder circuit 13, and the column addresses are supplied to the column decoder circuit 15.

A command latch 17 is connected to the I/O buffer 14, and latches command inputs input via the I/O buffer 14. A command decoder 18 is connected to the command latch 17. The command decoder 18 decodes commands and outputs various kinds of control signals. On the basis of the control signals output from the command decoder 18, operations of the sense/latch circuit 12, the row decoder circuit 13, the I/O buffer 14, the column decoder circuit 15, and the address latch 16 are controlled.

Apart from the circuits, the flash memory is provided with circuits such as a high voltage/intermediate voltage generation circuit for generating high voltage and intermediate voltages to be supplied to the row decoder circuit 13 and the memory cell array 11 when writing and erasing data. These circuits are not shown.

Figure 4:
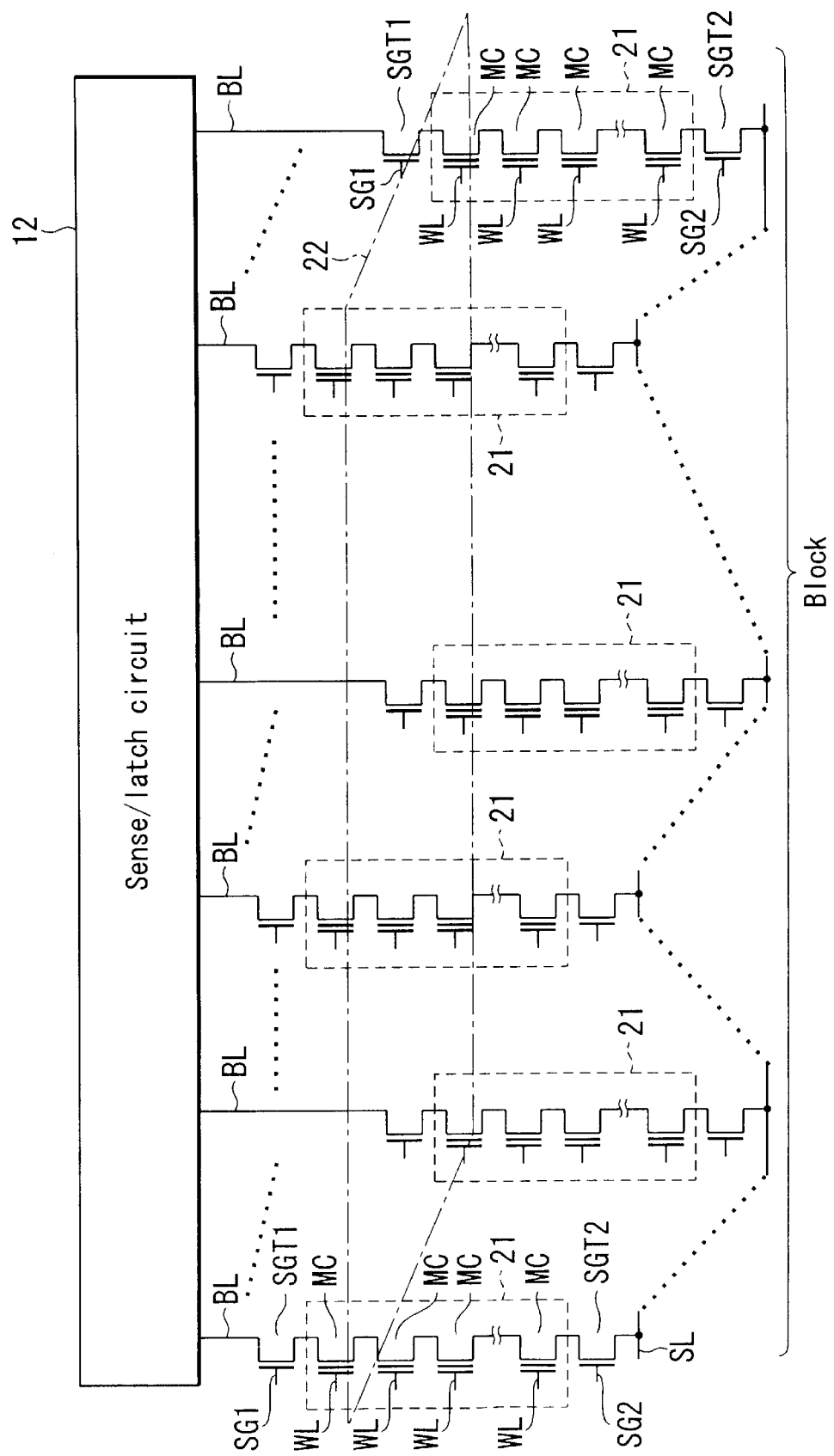
FIG. 4 is a circuit diagram showing a detailed constitution of one block of the memory cell array of FIG. 3.

FIG. 4 shows a detailed circuit constitution of one block of the memory cell array 11 of FIG. 3 together with the sense/latch circuit 12.

A plurality of NAND cells 21 is provided in one block of the memory cell array 11. A plurality of memory cells MC constituted of non-volatile transistors having control gates and floating gates is provided in each of the NAND cells 21. Source-drain paths of the plurality of memory cells MC are connected in series.

One end of a first select transistor SGT1 and one end of a second select transistor SGT2 for selecting a NAND cell are respectively connected to one end side and the other end side of the NAND cell. The other end of each of the first select transistors SGT1 is connected to the corresponding bit line BL. The other end of each of the second select transistors SGT2 are all connected to the source line SL.

The control gates of the plurality of memory cells MC in one block are commonly connected to corresponding ones of the plurality of word lines WLs that are provided extendedly through the block. The select gates of the first select transistors SGT1 and the select gates of the second select transistors SGT2 are commonly connected to a first select gate line SG1 and a second select gate line SG2 that are provided extendedly through the block, respectively. In the block, the plurality of memory cells MCs having their control gates commonly connected to one word line constitutes one page 22. When data is written, writing is performed in parallel on the basis of one-page unit in the memory cells of the memory cell array 11.

Figure 5:
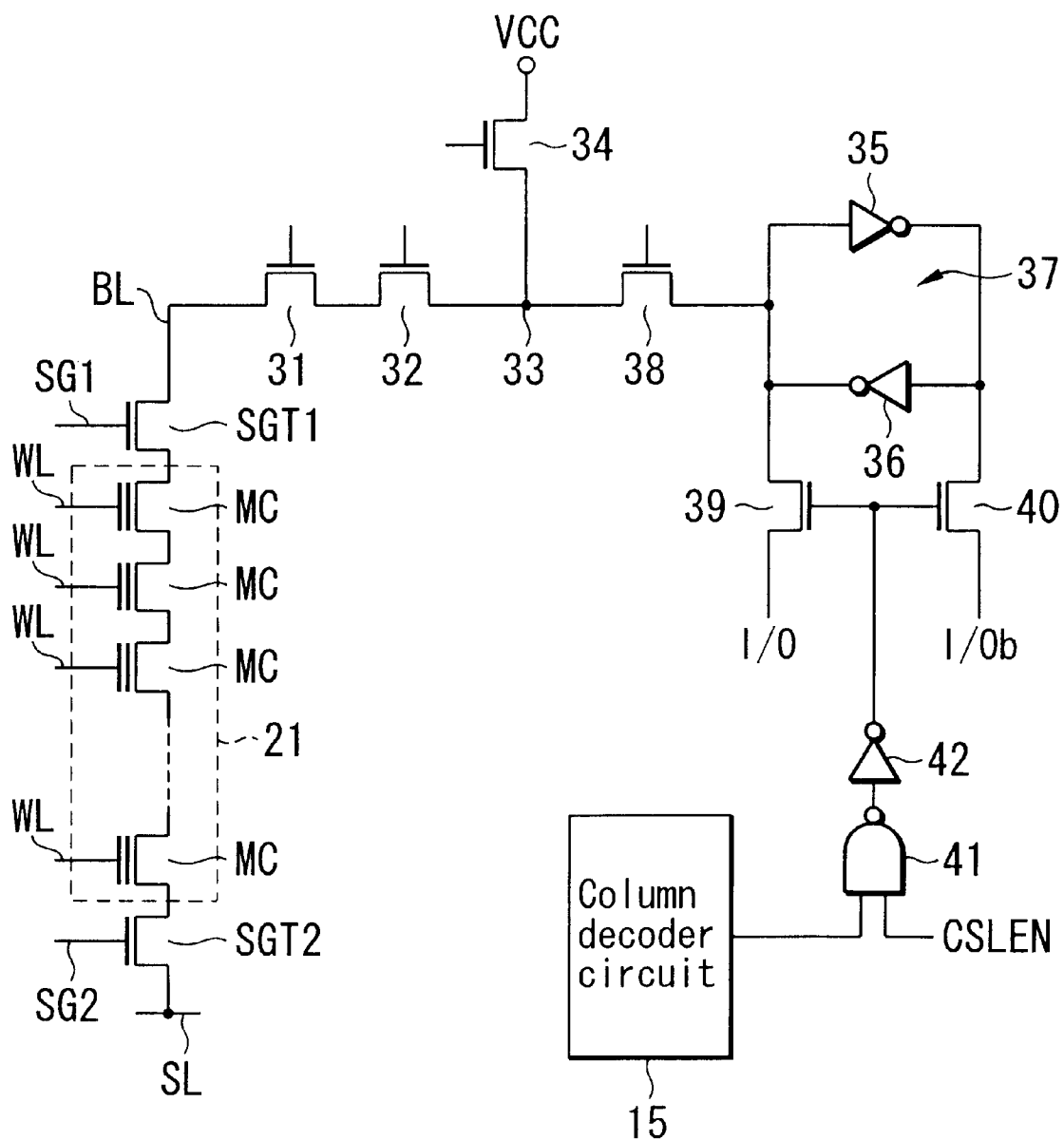
FIG. 5 is a circuit diagram showing a detailed constitution of a part, which is related to one NAND cell of the memory cell array of FIG. 3, of a sense/latch circuit.

FIG. 5 shows a detailed circuit constitution of a part, which is related to one NAND cell 21 of FIG. 3, of the sense/latch circuit 12. The bit line BL is connected to a node 33 via in series a source-drain path of a transistor 31 for bit line selection and a source-drain path of a transistor 32 that is controlled to be conducted when the bit line BL is selected, respectively. Between the node 33 and a supply node of a power supply voltage Vcc, a source-drain path of a precharging transistor 34 for precharging the node 33 are inserted.

Two inverters 35 and 36 constitute a latch circuit 37. When reading data from the memory cells MC, the latch circuit 37 senses and latches data stored in the memory cell MC. When writing data into the memory cell MC, the latch circuit 37 latches data to be written supplied from the outside. An input node of the inverter 35 in the latch circuit 37 is connected to the node 33 via the source-drain path of a transistor 38 which is controlled to be conducted when data is read from and written into the memory cell MC. An output node of the other inverter 36 in the latch circuit 37 is connected to an I/O line via a source-drain path of a transistor 39 for column selection. An output node of the inverter 35 is connected to an I/Ob line via a source-drain path of a transistor 40 for the column selection. The I/O line and the I/Ob line are both connected to the I/O buffer 14 of FIG. 3.

A circuit constituted of an NAND circuit 41 and an inverter 42 outputs a control signal for controlling to conduct the transistors 39 and 40 for the column selection. A decode output signal of the column data circuit 15 and a column select enable signal CSLEN are input to the NAND circuit 41. An output signal of the NAND circuit 41 is input to the inverter 42. An output signal of the inverter 42 is input in parallel to each gate of the transistors 39 and 40 for the column selection.

Figure 6:
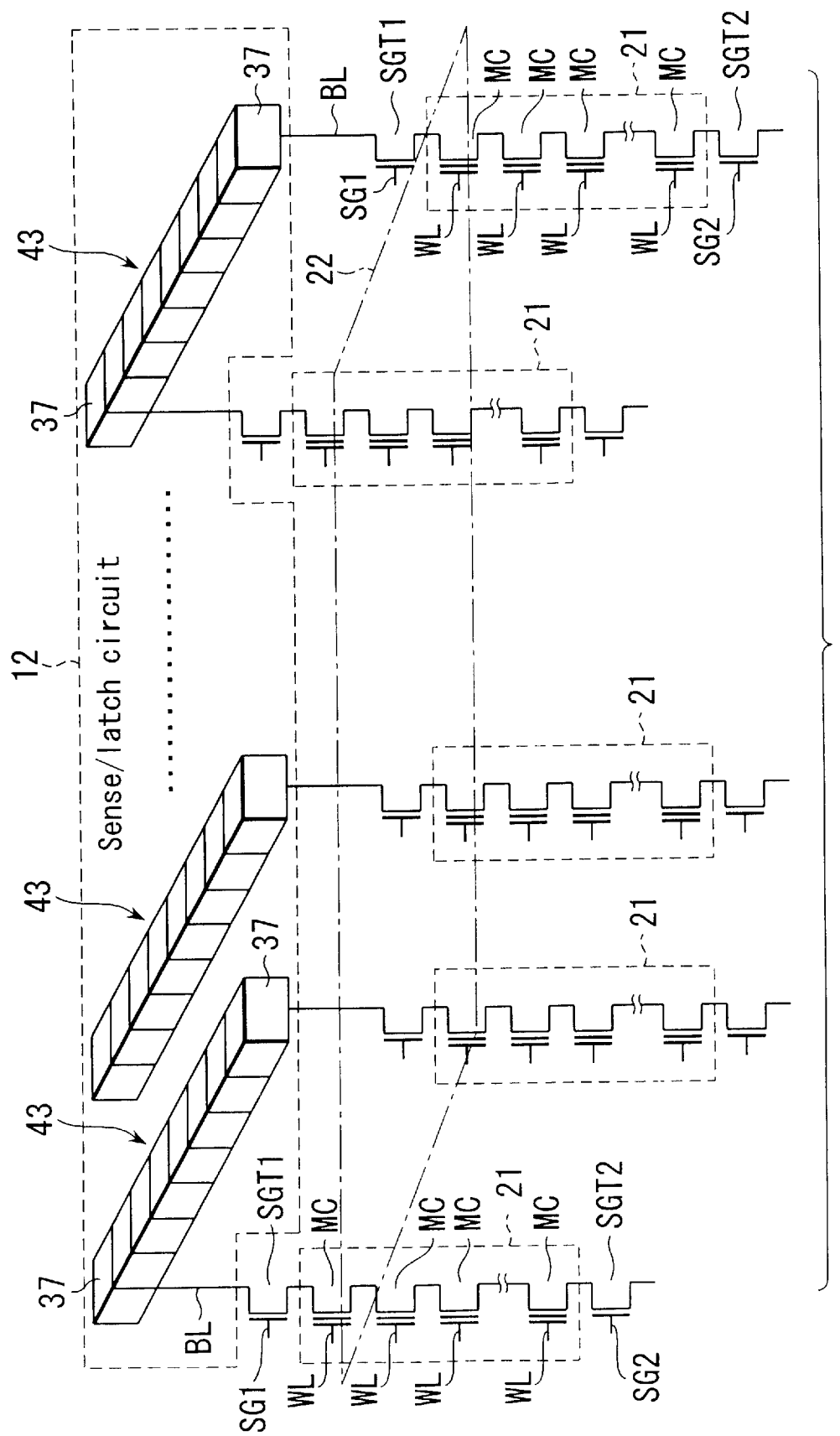
FIG. 6 is a circuit diagram schematically showing the relation between a plurality of latch circuits and a plurality of bit lines provided in the sense/latch circuit of FIG. 3.

FIG. 6 schematically shows the relation between a plurality of latch circuits 37 and a plurality of bit lines provided in the sense/latch circuit 12 of FIG. 3. In the sense/latch circuit 12, the latch circuits 37 are provided for a parallel bit number of I/O data, that is, a number of I/O line pairs consisting of the I/O line and the I/Ob line. For example, if the parallel bit number of the I/O data is eight bits, eight latch circuits 37 are provided for every eight NAND cells 21. The eight latch circuits 37 are connected in series to constitute a latch circuit group 43. In the sense/latch circuit 12, the latch circuit groups 43 are provided for the number of columns in the memory cell array 11. When reading data from the memory cell array 11, each of the latch circuit groups 43 temporarily latches the data read from the corresponding memory cells. When writing data, each of the latch circuit group 43 latches data to be written for one byte (eight bits) sent from the I/O buffer 14. A plurality of the latch circuit groups 43 is selected in accordance with column addresses.

Next, the page copying operation performed in the memory having such a constitution will be described with reference to FIG. 7 to FIG. 10.

First described will be a page data reading operation in which the page of a copy source is specified and data of one page is read.

Figure 7:
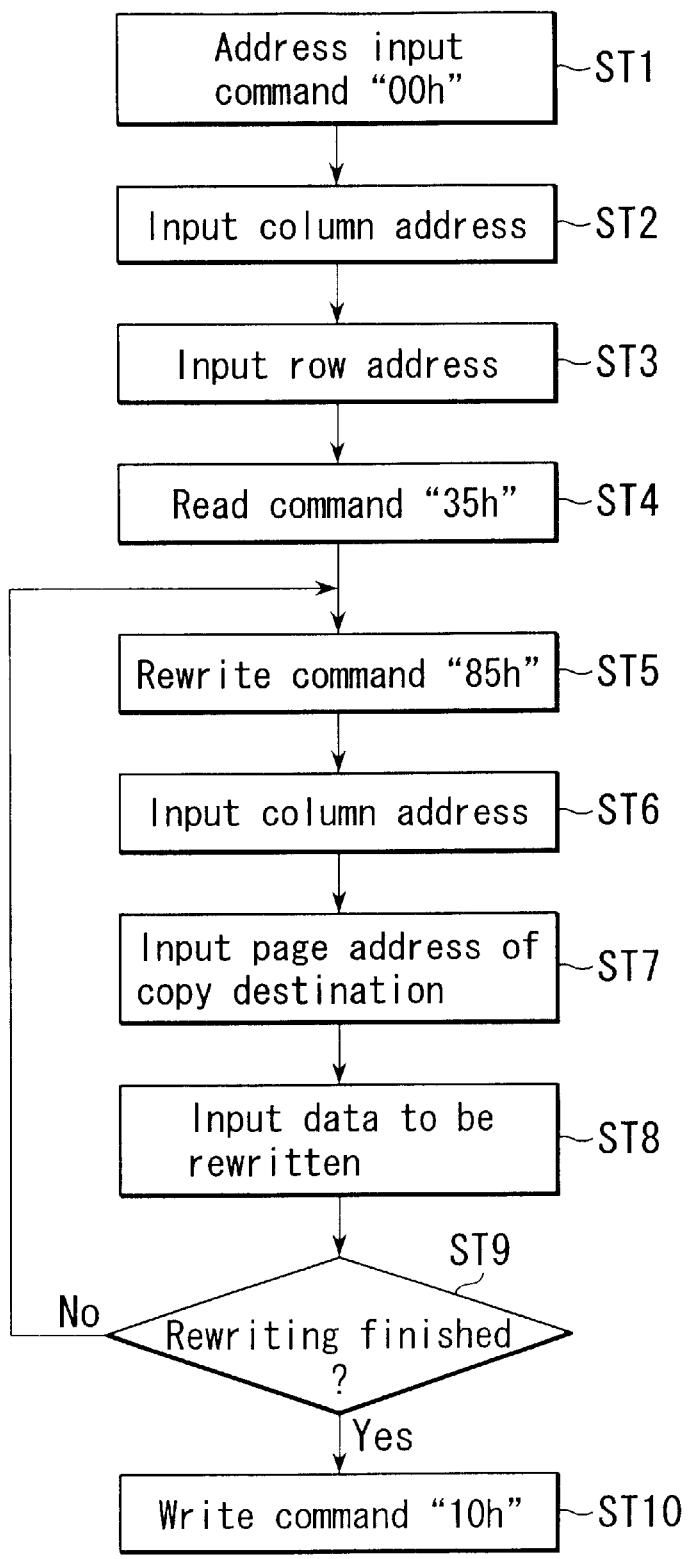
FIG. 7 is a flowchart showing a page copying operation of the NAND flash memory of FIG. 3.

In the page data reading operation, first, as shown in step ST1 of FIG. 7, an address input command "00h" is latched by the command latch 17. "h" in the command "00h" indicates that the data is hexadecimal data.

Figure 8:
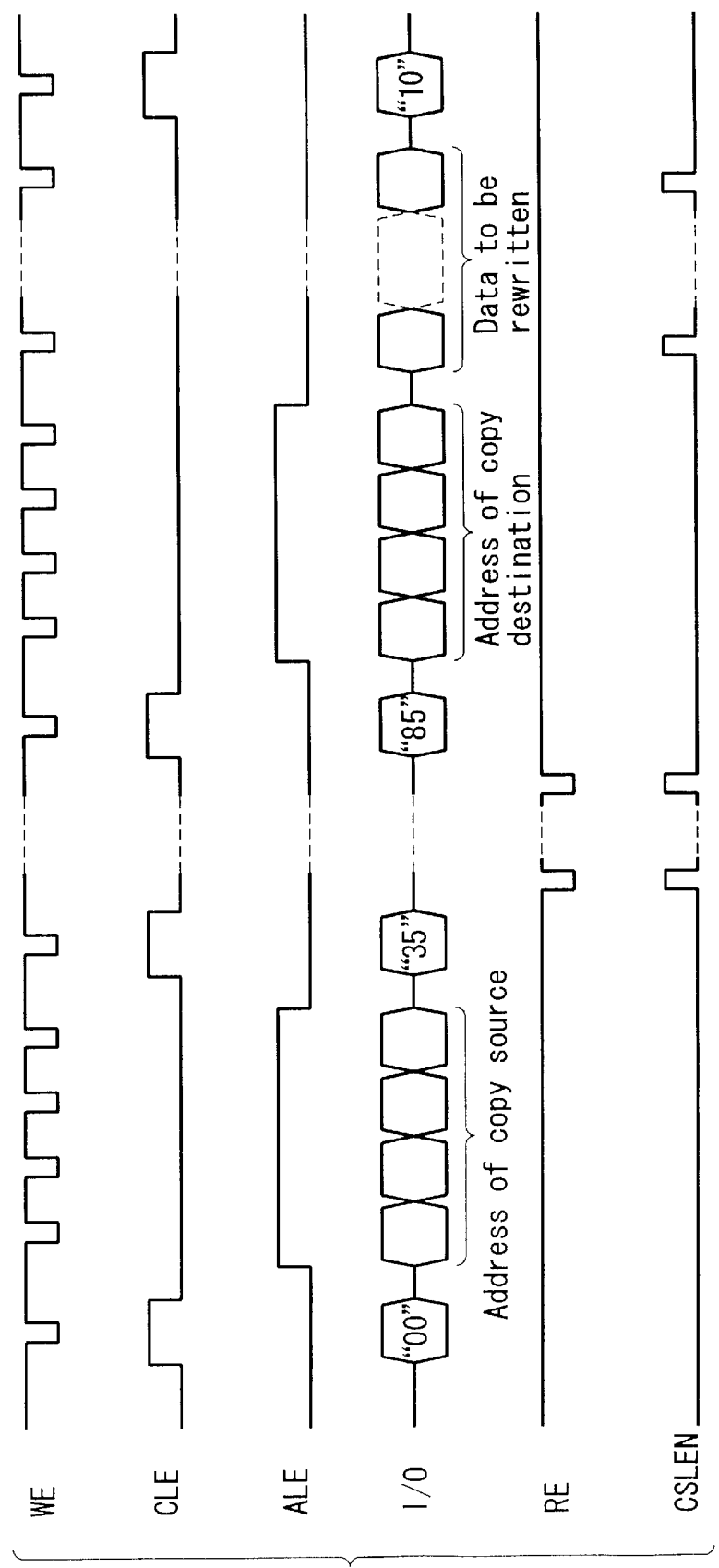
FIG. 8 is a signal waveform view of essential parts during the page copying operation of the NAND flash memory of FIG. 3.

Next, as shown in step ST2, a column address input of a copy source address is latched by the address latch 16. Then, as shown in step ST3, a row address input of the copy source address is latched by the address latch 16. When the address input command and the copy source address are latched, a command latch enable signal CLE and an address latch enable signal ALE are each set for "H" level, as shown in FIG. 8.

The column address latched by the address latch 16 is sent to the column decoder circuit 15, and the row address is sent to the row decoder circuit 13. After this, one page of the memory cell array 11 from which data is read is specified according to the outputs of the column decoder circuit 15 and the row decoder circuit 13.

After this, as shown in step ST4, a read command "35h" is latched by the command latch 17. After the read command is input, data is sequentially read from the specified memory cells of one page in the memory cell array 11 in synchronization with a read enable signal RE. The read data of one page is sensed and temporarily latched by the sense/latch circuit 12.

This data reading operation will be described using the circuit of FIG. 5. Prior to reading data from each of the plurality of memory cells MC provided in the NAND cell 21, the transistor 34 is conducted, and the node 33 is precharged to a level "H" that corresponds to the power supply voltage Vcc. When the data is read, the transistors 31 and 32 are conducted, and the "H" level of the node 33 is transmitted to the bit line BL. Depending upon the stored data in the memory cells MC selected in the NAND cell 21, the potential of the bit line BL maintains the precharged level or is discharged to a level "L" to be lowered. In other words, the potential of the node 33 is decided in accordance with the stored data in the selected memory cell.

Furthermore, after the transistors 31 and 32 are conducted and the potential of the node 33 is decided in accordance with the stored data of the selected memory cell, the transistor 38 is conducted, and the potential of the node 33 is sent to the latch circuit 37. At this point, if the potential of the node 33 is on the level "L", the latch circuit 37 performs data sensing so that the I/O side will be on the level "H" and the I/Ob side will be on the level "L", and latches the sensed data.

Next, a data rewriting operation will be described in which the column address to be rewritten is specified in the data of one page that has been read and data input is performed.

In the data rewriting operation, as shown in step ST5 of FIG. 7, a rewrite command "85h" is latched by the command latch 17. Next, as shown in step ST6, the column address of the copy destination address corresponding to the latch circuit 37 that rewrites data is latched by the address latch 16. Then, as shown in step ST7, the row address of the copy destination address is latched by the address latch 16. Further, as shown in step ST8, the data to be rewritten is input to the sense/latch circuit 12 via the I/O buffer 14.

At this point, the column address latched by the address latch 16 is sent to the column decoder circuit 15, and the page address of the copy destination, that is, the row address is sent to the row decoder circuit 13. The data to be rewritten supplied from the I/O buffer 14 is sent to one of the plurality of latch circuit groups 43 in the sense/latch circuit 12 in accordance with the output of the column decoder circuit 15, and its eight latch circuits 37 sequentially perform data rewriting.

This data rewriting operation will be described using the circuit of FIG. 5. The data to be rewritten from the I/O buffer 14 is transmitted to the data line I/O and the data line I/Ob. Further, the decoding output of the column decoder circuit 15 to which the column address is input reaches the level "H", and the column select enable signal CSLEN reaches the level "H". Accordingly, the output signal of the NAND circuit 41 reaches the level "L", and the output signal of the inverter 42 reaches the level "H".

Consequently, the transistors 39 and 40 for column selection are conducted. As a result, the data to be rewritten is supplied to the latch circuit 37, and the data in the latch circuit 37 is rewritten.

Figure 9:
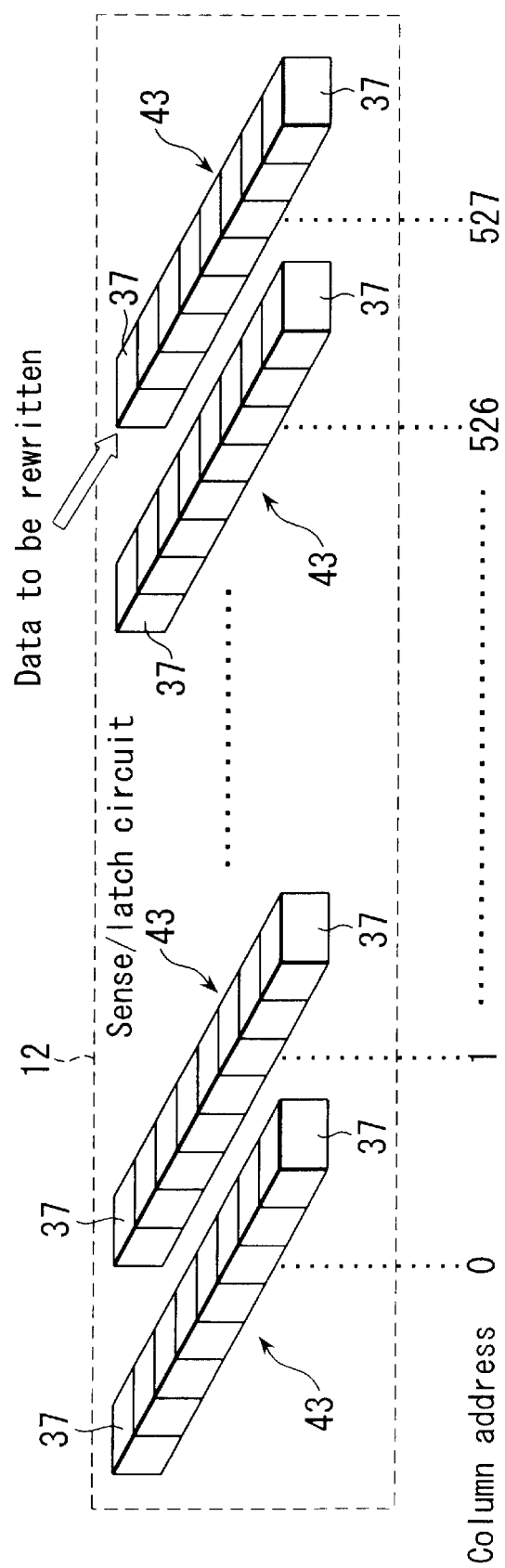
FIG. 9 is a block diagram schematically showing a state in which data to be rewritten is supplied to a latch circuit group during the page copying operation of the NAND flash memory of FIG. 3.

For example, as shown in FIG. 9, column numbers "0" to "527" are allotted to the latch circuit groups 43 that are each constituted of eight latch circuits 37. If the column number "527" is specified, the data to be rewritten from the I/O buffer 14 is input to the latch circuit group 43 that corresponds to the column number "527", as shown in FIG. 9. The eight latch circuits 37 that constitute the latch circuit group 43 are connected in series. The column select enable signal CSLEN changes from the level "L" to the level "H" successively eight times as shown in FIG. 8. This makes the data to be rewritten of eight bits sequentially transfer to the eight latch circuits 37 one after another to be latched thereby. As a result, the latched data of the eight latch circuits 37 in the latch circuit group 43 is replaced with the rewritten data. At this point, the data in the latch circuit group 43 that does not need to be rewritten remains as it is. Only the latched data in the latch circuit group 43 to which the rewritten data is input after the input of the address is rewritten.

Figure 10:
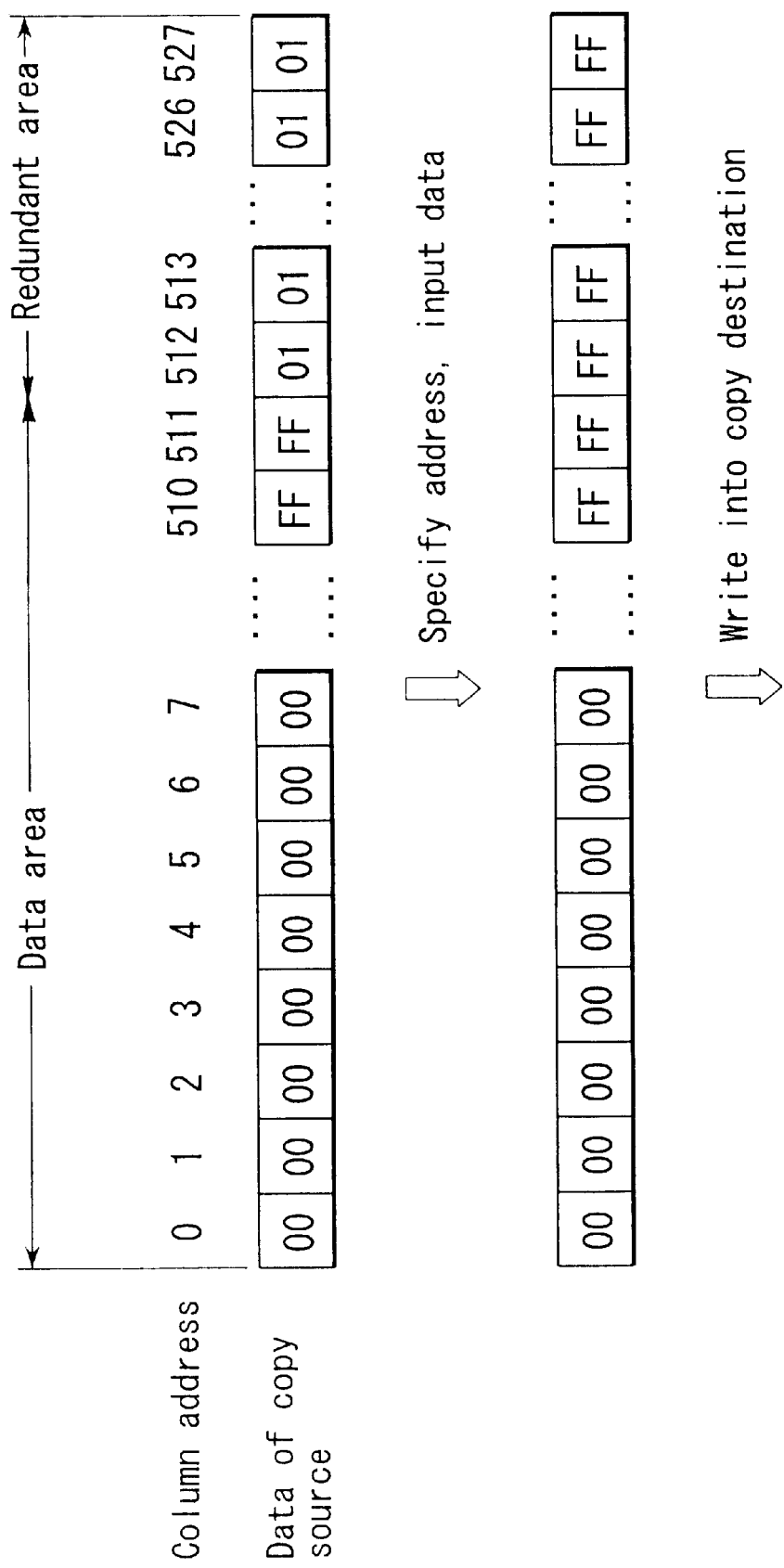
FIG. 10 is a view showing the changing state of some of the data in the latch circuit group during the page copying operation of the NAND flash memory of FIG. 3.

As shown in FIG. 10, when there are 528 patterns "0" to "527" of the column numbers, the area of "0" to "511" in the data of one page is the data area, and the area of "512" to "527" is the redundant area. After the data is read from the memory cell array 11, the latched data of sixteen latch circuit groups 43 that correspond to the column number "512" to "527" of the redundant area is, for example, "01". In this case, if the rewritten data "FF" is input to each of the latch circuit groups 43, the data in the latch circuit groups 43 is changed to "FF" after the rewriting.

Next, as shown in step ST9 of FIG. 7, whether the rewriting has been finished or not is judged. If it has not, back in step ST5, the data in the latch circuit group 43 is rewritten to the data to be rewritten. If it is judged that the rewriting has been finished in step ST9, a write command "10h" is latched by the command latch 17 as shown in step ST10. The write command is latched and decoded, thereby having the latched data in the latch circuit group 43 written into the page of the copy destination in the memory cell array 11. The page address of the copy destination for the writing has already been input in step ST7. On the basis of the row address that corresponds to the page address of the copy destination, the word lines in the memory cell array 11 are selectively driven, and the data writing is performed.

Figure 11:
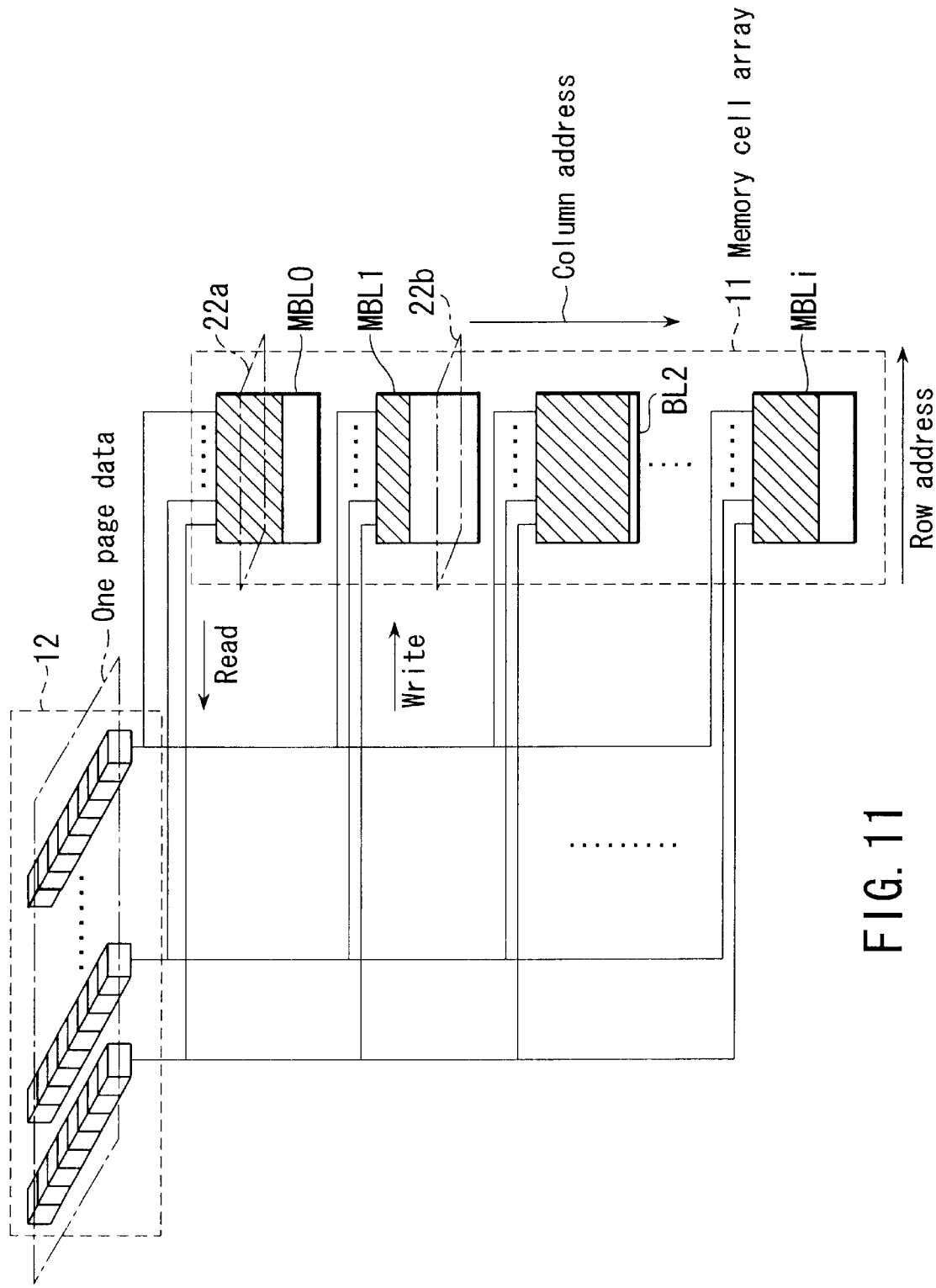
FIG. 11 is a block diagram showing the positional relation of data of one page before and after the page copying operation of the NAND flash memory of FIG. 3.

If such an operation is performed, as shown in FIG. 11, for example, data of one page 22a in a block MBL0 that is in the memory cell array 11 is read by the latch circuit group 43. After a part of the read data, for example, the data in the above redundant area is rewritten, the read data is written into a page 22b in a block MBL1 that is different from the above one.

In the above description, the way of driving the first and second select gate lines SG1 and SG2 has not been described. When the block that corresponds is selected, the first and second select gate lines SG1 and SG2 are driven in accordance with the output of the row decoder circuit 13. Thereby, first and second select transistors SGT1 and SGT2 that are connected to all the NAND cells 21 in one block are controlled to be conducted. Accordingly, one end of each NAND cell 21 is connected to the corresponding bit line BL via each first select transistor SGT1, and the other end of each NAND cell 21 is connected to the source line SL via each second select transistor SGT2. When the data is read, the source line SL is supplied with low potential that corresponds to the level "L". When the data is written, the source line SL is put in a potentially floating state.

According to the above embodiment, in the memory that writes a large quantity of data as a batch, when rewriting data written in one page into a different page, it is possible to rewrite and copy only the data that needs to be rewritten, with copied data as it is.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents. For example, the hexadecimal command data in the above description is merely one example, and hence the present invention is not limited thereto. Further, in the above embodiment, it has been described that after the data of one page in the memory cell array is read, the read data in the redundant area is rewritten, and then the data is written into a different page. The read data not only in the redundant area but also in the data area may be rewritten. In this case, after the data of one page in the memory cell array is read by the sense/latch circuit 12, an arbitrary column in the sense/latch circuit 12 is selected, and data to be rewritten is supplied to the sense/latch circuit 12. It is thereby possible to rewrite the data of one page of the arbitrary column that has been read out in the sense/latch circuit 12 and write it into the different page.

Furthermore, in the above embodiment, it has been described that the semiconductor storage device is the NAND flash memory having the NAND cells. Other than this, the semiconductor storage device may be a non-volatile memory having such as NOR-type cells, DINOR cell type, AND cell type, NOR cell type with selective transistors.

What is claimed is:

1. A semiconductor storage device comprising:
    a memory cell array which data is written into and read from every page; and
    control circuit which is connected to said memory cell array and which rewrites at least part of data in data of one page read from an arbitrary page in said memory cell array and which writes the rewritten data into another page in said memory cell array.

2. The semiconductor storage device according to claim 1, wherein said control circuit includes a sense/latch circuit that senses and latches said data of one page read from the arbitrary page in said memory cell array.

3. The semiconductor storage device according to claim 2, wherein said sense/latch circuit includes a plurality of latch circuits.

4. The semiconductor storage device according to claim 3, wherein said plurality of latch circuits are specified according to their addresses, and rewriting of the data is performed by the specified latch circuit.

5. The semiconductor storage device according to claim 4, wherein said control circuit includes a latch specifying circuit which specifies said plurality of latch circuits by the address.

6. The semiconductor storage device according to claim 5, wherein said latch specifying circuit is a column decoder circuit.

7. The semiconductor storage device according to claim 6, wherein said page specifying circuit is a row decoder circuit.

8. The semiconductor storage device according to claim 2, wherein said control circuit includes a data I/O circuit connected to said sense/latch circuit which outputs data of one page latched by the sense/latch circuit and which gives supplied data to be written to the sense/latch circuit.

9. The semiconductor storage device according to claim 1, wherein said control circuit includes a page specifying circuit which specifies the page in said memory cell array.

10. The semiconductor storage device according to claim 1, wherein said memory cell array comprises a plurality of non-volatile transistors, said plurality of non-volatile transistors are serially connected to form a NAND cells.

11. A semiconductor storage device comprising:
    a memory cell array constituted of a plurality of word lines, a plurality of bit lines, and a plurality of memory cells which is connected to said plurality of word lines and said plurality of bit lines, writing and reading of data are performed every page which is constituted of said plurality of memory cells commonly connected to one word line;
    a row decoder which is connected to said plurality of word lines and which selects an arbitrary word line from said plurality of word lines to select an arbitrary page in said memory cell array; and a sense/latch circuit which is connected to said plurality of word lines and which senses data of one page read from said memory cell array and which latches the sensed data when reading data from said memory cell array and which supplies said memory cell array with the latched data of one page and which rewrites arbitrary data from the latched data of one page when writing data in said memory cell array.

12. The semiconductor storage device according to claim 11, wherein said sense/latch circuit includes a plurality of latch circuits.

13. The semiconductor storage device according to claim 12, further comprising a latch specifying circuit which specifies said plurality of latch circuits by the address.

14. The semiconductor storage device according to claim 13, wherein said latch specifying circuit is a column decoder circuit.

15. The semiconductor storage device according to claim 11, wherein said plurality of memory cells is each constituted of non-volatile transistor, and a plurality of non-volatile transistors are connected in series to form a NAND cell.

16. The semiconductor storage device according to claim 11, further comprising a data I/O circuit which is connected to said sense/latch circuit and which outputs data of one page latched by said sense/latch circuit and which gives supplied data to be written to said sense/latch circuit.

17. An operation method of a semiconductor storage device, comprising:

reading data in parallel from a plurality of memory cells in a certain memory area of a non-volatile semiconductor storage device that has a plurality of memory areas each including a plurality of memory cells;

latching said read data by a plurality of latch circuits, and rewriting at least part of said data latched by said plurality of latch circuits; and writing said data at least part of which is rewritten into said plurality of memory cells of said memory area which is different from said memory area from which said data is read.

* * * * *